United States Patent
Ko et al.

(10) Patent No.: US 6,933,360 B2
(45) Date of Patent: Aug. 23, 2005

(54) ORGANOSILICATE POLYMER AND INSULATING FILM THEREFROM

(75) Inventors: Min-Jin Ko, Taejeon (KR); Bum-Gyu Choi, Taejeon (KR); Dong-Seok Shin, Seoul (KR); Myung-Sun Moon, Taejeon (KR); Jung-Won Kang, Seoul (KR); Hae-Young Nam, Cheongju (KR); Young-Duk Kim, Taejeon (KR); Gwi-Gwon Kang, Seoul (KR)

(73) Assignee: LG Chem, Ltd., Seoul (KR)

( * ) Notice: Subject to any disclaimer, the term of this patent is extended or adjusted under 35 U.S.C. 154(b) by 141 days.

(21) Appl. No.: 10/332,452

(22) PCT Filed: May 13, 2002

(86) PCT No.: PCT/KR02/00888

§ 371 (c)(1),
(2), (4) Date: Jan. 9, 2003

(87) PCT Pub. No.: WO02/098955

PCT Pub. Date: Dec. 12, 2002

(65) Prior Publication Data

US 2003/0181750 A1 Sep. 25, 2003

(30) Foreign Application Priority Data

Jun. 7, 2001 (KR) .......................... 2001-31816

(51) Int. Cl.$^7$ ............................................. C08G 77/22
(52) U.S. Cl. .......................... 528/30; 556/450; 438/678
(58) Field of Search .......................... 556/450; 528/30; 438/678

(56) References Cited

U.S. PATENT DOCUMENTS 5,302,734 A  4/1994 Jung et al.

FOREIGN PATENT DOCUMENTS

GB  591149 A  8/1947

OTHER PUBLICATIONS

Brondani et al., A New Trialkoxysilation Reaction, the Cross–Coupling of (Tri–Isopropyloxysilyl)Methyl Grignard Reagent with Organic Halides, Journal of Organometallic Chemistry, 451 (1993) C1–C3.*

Brondani et al., Polyfunctional Carbosilanes and Organosilicon Compounds. Synthesis via Grignard Reactions, Tetrahedron Letters, vol. 34, No. 13, pp. 2111–2114, 1993.*

Corriu et al., New Mixed Organic– Inorganic Polymers: Hydrolysis and Polycondensation of Bis(trimethoxysilyl)organometallic Precursors, Mater. Chem. 1992, 4, 1217–1224.*

Corriu et al., Polysilsesquioxanes Materials Containing a Dienic Unit: Unexpected Reactivity of the Organic Unit, J. Mater. Chem. 2000, 4, 1113–1120.*

Brondani et al, In: Tetrahedron Letters, Mar. 26, 1993, vol. 34 (13), p. 2111–4.

* cited by examiner

*Primary Examiner*—Johan Richter
*Assistant Examiner*—Chukwuma Nwaonicha
(74) *Attorney, Agent, or Firm*—Birch, Stewart, Kolasch & Birch, LLP

(57) ABSTRACT

The present invention relates to a low dielectric substance essential for a next generating electrical device such as a semiconductor device having high performance and high density, and particularly to a process for preparing a low dielectric organosilicate polymer, a hydrolysis condensation product of a carbon-bridged oligomer; a process for manufacturing an insulating film using an organosilicate polymer prepared by the process; and an electrical device comprising an insulating film prepared by the process. The organosilicate polymer prepared according the process of the present invention is thermally stable, and has good film-forming prosperities, excellent mechanical strength and crack resistance, and the film manufactured therefrom has excellent insulating properties, film uniformity, dielectric properties, crack resistance, and mechanical strength.

5 Claims, No Drawings

ORGANOSILICATE POLYMER AND INSULATING FILM THEREFROM

This application is the national phase under 35 U.S.C. §371 of PCT International Application No. PCT/KR02/00888 which has an International filing date of May 13, 2002, which designated the United States of America.

BACKGROUND OF THE INVENTION (a) Field of the Invention

The present invention relates to low dielectric materials essential for a next generation electric device such as a semiconductor device, with a high density and high performance. More specifically, the present invention relates to a process for preparing an organosilicate polymer that is thermally stable and has good film-forming properties and excellent mechanical strength and crack resistance, and a process for manufacturing an insulating film using an organosilicate polymer prepared by the process.

(b) Description of the Related Art

The semiconductor industry is moving toward increasing device complexity, requiring shrinking geometric dimensions and higher component integration with greater dimensional densities in integrated circuit devices, e.g. memory and logic chips. This has led to an increase in the number of wiring levels and a reduction in wiring pitch to increase the wiring density. Current leading-edge logic processors have 7~8 levels of high density interconnect, and interconnect line widths are scheduled to decrease to 0.1 $\mu$m around the year 2004.

As device dimensions shrink to less than 0.25 $\mu$m, propagation delay, crosstalk noise, and power dissipation due to resistance-capacitance (RC) coupling become significant. The smaller line dimension increases the resistivity of metal wires, and the narrow intermetal spacing increases the capacitance between the metal wires. Thus, although the switching speed of devices will increase as the feature size decreases, the interconnect delay becomes the major fraction of the total delay and limits the overall chip performance. Accordingly, in order to prepare a chip having high speed, a conductor having a low resistance and a dielectric material having a low dielectric constant should be used. In addition, the use of low dielectric material can remarkably decrease the power dissipation and crosstalk noise.

Recently, several semiconductor device manufacturers have put test products on the market that show improvements in their performance of 20% or more, using copper wiring with high electric conductivity instead of using the conventional aluminum wiring. A shift to use of new materials that exhibit low dielectric constant performance, for use in interconnects, has recently been undertaken. If the dielectric films between interconnect layers in integrated circuits can make use of these materials, the effect on operating speed will be the same as that which resulted with the switch from aluminum to copper technology. For instance, if the dielectric constant of the dielectric material is changed from 4.0 to about 2.5, IC operating speed will be improved by about 20%.

The interlayer dielectric material used in semiconductor integrated circuit devices is predominantly $SiO_2$, which is generally formed using chemical vapor deposition (CVD) to withstand various processing operations associated with the conditions under which a dielectric is formed. The dielectric constant of silicon thermal oxidation films, which have the lowest dielectric constant, is on the order of 4.0. Attempts have been made to reduce the dielectric constant by introducing fluorine atoms into an inorganic film deposited by CVD. However, the introduction of fluorine atoms in large amounts decreases the chemical and thermal stability, so the dielectric constant achieved in actual practice is on the order of 3.5. Fluorinated oxides can provide an immediate near-term solution, and a shift to new types of insulating materials with sub-3 dielectric constant may be required.

One class of candidates is organic polymers, some of which have a dielectric constant of less than 3.0. Incorporating fluorine into such organic polymers is known to further lower the dielectric constant. Most organic polymers do not, however, posses the physico-chemical properties required for on-chip semiconductor insulation, particularly thermal stability and mechanical properties (sufficient to withstand back-end line fabrication temperatures within the range of 400~450° C.). Few organic polymers are stable at temperature greater than 450° C. They also have a low glass transition temperature and thus elasticity thereof remarkably decreases at high temperatures, and they have a very high linear expansion coefficient. Since the temperature rises to 450° C. during semiconductor IC integration and packaging processes, the resulting low thermal stability and elasticity and high linear expansion coefficient can deteriorate the reliability of the devices.

Recently, in order to solve thermal stability problems of organic polymers, the development of organic silicate polymers using a sol-gel process has emerged. In particular, organic SOG (Spin On Glass), having a dielectric constant in the range of about 2.7~3.3, has been proposed for use as interlayer dielectrics in which the side chain of an organic component (an alky group such as methyl) is bonded to the backbond chain of a siloxane bond. However, the organosilicate polymers show poor mechanical properties. For instance, polymethylsilsesquioxane shows crack formation during processing unless the film is very thin (often <1 $\mu$m), and shows low mechanical modulus due to the introduction of the alkyl group.

Miller et al. have reported a method of toughening the silsesquioxane material systems by incorporating a small amount of a polymeric substituents such as a polyimide. A method of mixing an inorganic fine particulate powder is known as a method for improving the mechanical strength of organosilicates. Although various systems have been proposed, there remains a need for a material having a suitable low dielectric constant and appropriate physico-chemical properties for use as an interlayer dielectric in the future generation of IC devices.

SUMMARY OF THE INVENTION

Accordingly, the present invention is made in consideration of the problems of the prior art, and it is an object of the present invention to provide a process for preparing a low dielectric material for a very low dielectric interlayer wiring insulating film that can make the speed of a semiconductor device high, decrease power consumption, and remarkably decrease cross-talk between metal wiring.

It is another object of the present invention to provide a process for preparing an organosilicate polymer having excellent crack resistance, mechanical strength, film-forming properties, and dielectric properties, and a process for manufacturing an insulating film containing the polymer prepared according to the process.

In order to achieve these objects, the present invention provides two kinds of processes for preparing an organosilicate polymer.

The first process comprises:

a) providing an organometallic silane compound represented by the following Chemical Formula 1;

b) causing a Grignard reaction of the a) organometallic silane compound represented by the Chemical Formula 1 alone to prepare a carbon-bridged silane oligomer and removing metallic compound by-products; and c) mixing the b) carbon-bridged silaneoligomer in organic solvent, and adding water and a catalyst thereto to cause hydrolysis and condensation to prepare an organosilicate polymer.

$$R^1_p R^2_{3-p} SiR^3 MX \qquad \text{[Chemical Formula 1]}$$

wherein $R^1$ is independently hydrogen, fluorine, aryl, vinyl, allyl, or fluorine-substituted or unsubstituted linear or branched $C_{1-4}$ alkyl;

$R^2$ is independently chlorine, acetoxy, hydroxy, or linear or branched $C_{1-4}$ alkoxy;

$R^3$ is $C_{1-6}$ hydrocarbon;

M is magnesium, mercury, or copper;

X is halogen; and p is an integer of 0 to 2.

In addition, the second process comprises:

a) providing an organometallic silane compound represented by the above Chemical Formula 1;

b) causing a Grignard reaction of i) the a) organometallic silane compound represented by the Chemical Formula 1; and ii) a silane compound or silane oligomer to prepare a carbon-bridged silane oligomer and removing metallic compound by-products; and c) mixing the b) carbon-bridged silaneoligomer in organic solvent, and adding water and a catalyst thereto to cause hydrolysis and condensation to prepare an organosilicate polymer.

The present invention also provides a composition for forming a semiconductor device insulating film comprising an organosilicate polymer prepared by one of the above processes, and a process for manufacturing an insulating film for a semiconductor device comprising coating and curing the composition.

Specifically, the composition for forming a semiconductor device insulating film of the present invention comprises a) an organosilicate polymer prepared by each organosilicate polymer preparation process; and b) an organic solvent.

The composition for forming an insulating film may further comprise c) one or more kinds of additives selected from a group consisting of organic molecules, organic polymer, organic dendrimer, colloidal silica, aerosol, xerosol, and surfactant.

The present invention also provides a process for manufacturing an insulating film for a semiconductor device, comprising a) providing an organosilicate polymer prepared by each organosilicate polymer preparation process;

b) dissolving the organosilicate polymer and, if necessary, an additive in a solvent;

c) coating the organosilicate polymer solution on a semiconductor device substrate; and d) drying and curing the coated insulating film, and a semiconductor device comprising an insulating film prepared by the process.

DETAILED DESCRIPTION AND THE PREFERRED EMBODIMENTS

The present invention will now be explained in more detail.

According to the present invention, a bridged organosilane oligomer is prepared from an organometallic silane compound represented by the following Chemical Formula 1, and an organosilicate polymer is prepared therefrom. The present invention provides a composition for forming an insulating film comprising the organosilicate polymer, a process for manufacturing an insulating film for a semiconductor device comprising the organosilicate polymer, and a semiconductor device comprising the insulating film.

The organosilicate polymer prepared according to the present invention, if applied to an insulating film for a semiconductor device, has excellent insulating properties, film uniformity, dielectric properties, crack resistance, and mechanical strength.

The following equations are examples of the organosilicate preparation process of the present invention.

The first preparation process accompanies the following Equation 1.

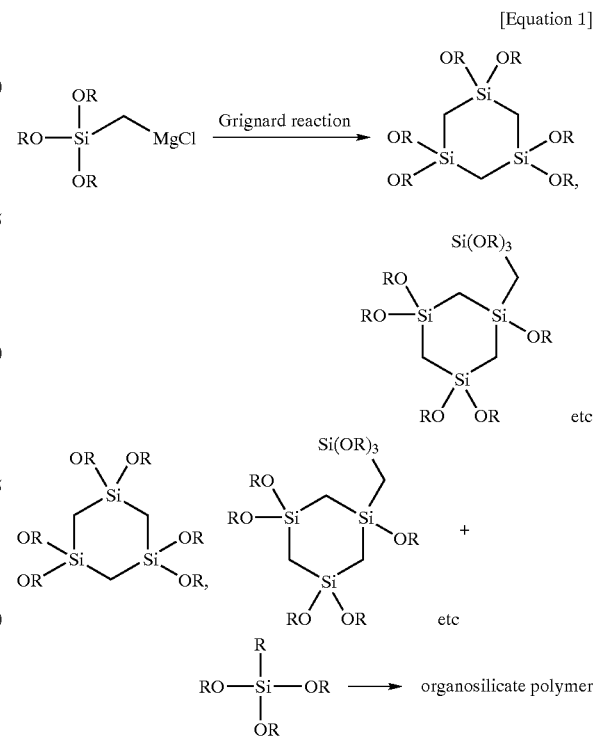

As shown, a Grignard reaction of the organometallic silane compound of the Chemical Formula 1 alone prepares a carbon-bridged silane oligomer, wherein metallic compound by-products are removed. The carbon-bridged silane oligomer is dissolved in an organic solvent, and water and a catalyst are added thereto to cause hydrolysis and condensation to prepare an organosilicate polymer. Also, the carbon-bridged silane oligomer and a silane compound or silane oligomer are mixed in an organic solvent, and water and a catalyst are added thereto to cause hydrolysis and condensation to prepare an organosilicate polymer.

The second process accompanies the following Equation 2.

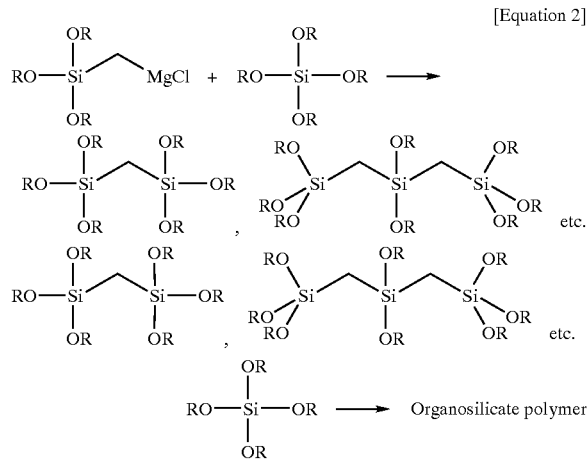

[Equation 2]

The Grignard reaction between the organometallic silane compound of the Chemical Formula 1 and a silane compound or silane oligomer prepares a carbon-bridged silane oligomer. The carbon-bridged silane oligomer is dissolved in an organic solvent, and water and a catalyst are added thereto to cause hydrolysis and condensation to prepare an organosilicate polymer. Also the carbon-bridged silane oligomer and a silane compound or silane oligomer are then mixed in an organic solvent, and water and a catalyst are added thereto to cause hydrolysis and condensation to prepare an organosilicate polymer.

Raw material for preparing the organosilicate polymer of the present invention is an organometallic silane compound satisfying the Chemical Formula 1. The organometallic silane compound is preferably prepared by a) introducing metal into a reaction vessel and drying it; and b) adding an organic solvent and silane compound represented by the following Chemical Formula 2 into the vessel to react them to prepare an organometallic silane compound satisfying the above Chemical Formula 1.

$$R^1_p R^2_{3-p} SiR^3 X$$ [Chemical Formula 2]

(wherein $R^1$ is independently hydrogen, fluorine, aryl, vinyl, allyl, or fluorine-substituted or unsubstituted linear or branched $C_{1-4}$ alkyl;

$R^2$ is independently chlorine, acetoxy, hydroxy, or linear or branched $C_{1-4}$ alkoxy;

$R^3$ is $C_{1-6}$ hydrocarbon;

X is halogen; and p is an integer of 0 to 2.

The reaction between metal and organosilane compound, for example, accompanies the following Equation 3.

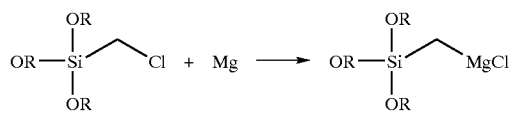

[Equation 3]

Namely, chloroalkylsilane, an organosilane compound satisfying the above Chemical Formula 2, is reacted with metal Mg to prepare one of the organometallic silane compounds satisfying the Chemical Formula 1.

The silane compound used in said process for preparing the carbon-bridged silane oligomer or final product organosilicate polymer includes an organic silane monomer comprising silicon, carbon, oxygen, and hydrogen, and organic silane oligomers that can be prepared therefrom. Preferably, a silane compound represented by the following Chemical Formula 3 or an oligomer thereof can be used to prepared the carbon-bridged silane oligomer or final product organosilicate polymer.

$$R^4_q R^5_{4-q} Si$$ [Chemical Formula 3]

(wherein $R^4$ is independently hydrogen, fluorine, aryl, vinyl, allyl, or fluorine-substituted or unsubstituted linear or branched $C_{1-4}$ alkyl;

$R^5$ is independently chlorine, acetoxy, hydroxy, or linear or branched $C_{1-4}$ alkoxy; and q is an integer of 0 to 3.)

According to the present invention, the carbon-bridged silane oligomer and silane compound or silane oligomer are hydrolyzed and condensed in the presence of a solvent while adding water and a catalyst to obtain an organosilicate polymer with a specific molecular weight, and hence a composition for forming an insulating film.

Sovents used for hydrolysis and condensation or for film coating include any agent or mixture of agents that will dissolve the composition to form a homogeneous liquid mixture of a silane compound or a silane oligomer and the carbon-bridged silane oligomer. The solvent used in the present invention includes, as examples, aliphatic hydrocarbons such as n-pentane, i-pentane, n-hexane, i-hexane, 2,2,4-trimethylpentane, cyclohexane, methylcyclohexane, etc.; aromatic hydrocarbons such as benzene, toluene, xylene, trimethylbenzene, ethylbenzene, methylethylbenzene, etc.; alcohols such as methylalcohol, ethylalcohol, n-propanol, i-propanol, n-butanol, i-butanol, sec-butanol, t-butanol, cyclohexanol, methylcyclohexanol, glycerol, etc.; ethers such as tetrahydrofuran, 2-methyl tetrahydrofuran, ethylether, n-propylether, isopropylether, diglyme, dioxane, dimethyl dio ethyleneglycol monomethylether, ethyleneglycol dimethylether, ethyleneglycol diethylether, propyleneglycol monomethylether, propyleneglycol dimethylether, etc.; esters such as diethylcarbonate, methylacetate, ethylacetate, ethyllactate; ethyleneglycol monomethylether acetate, propyleneglycol monomethylether acetate, ethylglycol diacetate, etc.; and amides such as N-methylpyrrolidone, formamide, N-methylformamide, N-ethylformamide, N,N-dimethylacetamide, N,N-diethylacetamide, etc.

All the solvents used in hydrolysis and condensation are removed after the reaction to obtain an organosilicate polymer oil or powder, and the organosilicate polymer can be dissolved in an organic solvent for forming a film or the organic solvent used in hydrolysis and condensation can be directly used to form a film. It is possible to use two or more kinds of the organic solvents together.

The present invention uses a catalyst in order to promote hydrolysis and condensation. The catalyst used in hydrolysis and condensation includes an acid catalyst, a base catalyst, a metal chelate compound, a salt catalyst, etc. For examples, the acid catalyst includes hydrochloric acid, nitric acid, sulfuric acid, phosphoric acid, formic acid, benzenesulfonic acid, toluene sulfonic acid, acetic acid, oxalic acid, malonic acid, maleic acid, fumaric acid, citric acid, propionic acid, etc.; and the base catalyst includes ammonia, sodium hydroxide, calcium hydroxide, potassium hydroxide, trimethylamine, triethylamine, diethanolamine, triethanolamine, dimethyl ethylalcohol amine, monomethyl diethanol aminediazabicycloundecene, pyridine, pyrrolpiperidine, choline, pyrrolidine, piperazine, etc. The metal chelate compound includes an organometallic compound comprising metals such as aluminum, titan, zirconium, tin, tantalum, etc.; and the salt catalyst includes a conjugate acid, and a conjugate base compound such as ammonium acetate. The acid, base, metal chelate compound, and salt catalysts can be used alone or in combination, and two or more kinds thereof can be used by stage.

The amount of catalyst added can be any amount that facilitates the hydrolysis and condensation reaction of the bridged silane oligomer and silane compound or silane oligomer, and the optimal amount will depend upon the chemical composition of the catalyst as well as the temperature under which the hydrolysis and condensation reaction occur. Generally the catalyst is added in an amount of 0.00001 to 1 moles, preferably 0.5 moles or less, per 1 mole of silicon atoms in the silane compound. If the added contents of the catalyst exceeds 1 mole per 1 mole of silicon atoms in the silane compound, the reaction rate will be very high and it will be difficult to control the molecular weight and gel may be easily produced.

In the present invention, water is added to cause hydrolysis of the silane compound. The amount of water is suitably 0.1 to 20 moles, preferably 1 to 10 moles per 1 mole of silicon atoms in the silane compound, and it can be added by stage or continuously. The catalyst may be previously added to an organic solvent, or it can be dissolved or dispersed when adding water.

There are no particular limitations on the reaction temperature when the product is made to have a desired molecular weight. The temperature may preferably be not higher than the boiling point of the organic solvent used, and may preferably be 0° C. to 100° C. in order to control the molecular weight of the resultant hydrolyzed product. There are no limitations on the reaction time at the time of hydrolysis and condensation, and the reaction may be completed at the time the product reaches a stated molecular weight. It is usually preferred to set the molecular weight of the final product within a range of from 500 to 1,000,000 as a weight-average molecular weight to form a uniform coating film.

The present invention's coating composition for forming an insulating film is prepared by dissolving the organisilicate polymers made by the above processes with organic solvents. If desired, various additives, such as organic molecules, organic polymer, organic dendrimers, colloidal silica, aerosol, xerosol, surfactants, etc. can be added to the composition for forming a certain amount of insulating film according to its purpose.

The solid content concentration in the solution may suitably be selected from the viewpoint of the desired viscosity of the solution or the thickness of the coating film, within the range whereby the solid content dissolves. In general the solid concentration of the composition of the present invention is in the range of 2 to 60 wt %, preferably 5 to 40 wt %.

The insulating film of the present invention is formed by coating the insulating film composition on a substrate such as silicon wafer, $SiO_2$ wafer, SiN wafer, semiconductor compound, etc. The insulating film can be formed by standard processes such as spin-coating, flow coating, dip coating, and spray coating. When the composition of the present invention is applied to an interlayer dielectric film for a semiconductor device, a spin coating method is preferred, since the in-plane distribution of the film thickness will thereby be uniform.

The thickness of the film can be controlled by changing the viscosity of the composition and the rotation speed of a spin coater, and for an interlayer insulating film for a multilayered circuit for a semiconductor device, 0.2 to 2 μm is suitable.

An organosilicate polymer insulating film with a three dimensional structure can be formed through drying and curing (hardening) processes after the coating process. Commonly, the drying and curing are performed respectively at 30 to 250° C. and 300 to 600° C., and particularly the curing is preferably performed at 350 to 500° C. If a curing temperature exceeds 600° C., thermal stability of an organosilicate polymer will decrease, and if it is less than 300° C., the strength of a film will decrease because condensation polymerization of an organosilicate polymer does not completely occur and dielectric properties might decrease due to the presence of residual functional groups.

The drying and curing processes can be continuously performed while elevating the temperature at a specific rate, or they can be performed by stage. If performed by stage, the drying and curing processes are suitably performed for 1 minute and 5 hours, respectively. Heating can be performed using a hot plate, oven, furnace, etc., under an inert gas atmosphere such as with nitrogen or argon, a helium atmosphere, an oxygen atmosphere such as with an oxygen-containing gas (for example, air), a vacuum, or under an ammonium and hydrogen-containing gas atmosphere. The drying and curing can be performed by the same heating method or by different heating methods.

After the curing processes, if necessary, surface treatment can be performed by a common method in order to minimize the amount of hydroxy groups inside the insulating film. The surface treatment is done to remove residual hydroxy groups by impregnating the insulating film in a silane compound solution such as hexamethyldisilazane, alkylchlorosilane, and alkylacetoxysilane to cause a reaction therebetween and drying it, or by heating the insulating film under a reducing gas atmosphere such as a hydrogen or fluorine-containing gas atmosphere at 300 to 600° C. for 1 minute or more.

The film obtained by the process is suitably used for an interlayer insulating film for a semiconductor device for LSI, system LSI, DRAM, SDRAM, D-RDRAM, etc.; a protection film such as surface coating film for a semiconductor device; an interlayer insulating film for a multilayered wiring substrate; and a protection film or an insulation-preventing film for a liquid display device, because it has excellent insulating properties, film uniformity, dielectric properties, crack resistance, and mechanical strength.

The present invention will now be explained in more detail with reference to the following Examples and Comparative Examples. However, these Examples are to illustrate the present invention, and the present invention is not limited thereto.

EXAMPLE

Example 1

Preparation of Organometallic Silane Compound Represented by the Chemical Formula 1

After introducing 0.71 g of magnesium in a reaction vessel and drying it, 15 ml of solvent-distilled tetrahydrofuran (THF) were added thereto. The temperature of the mixture was lowered to 0° C., and 5 g of chloromethyl triethoxy silane, an organosilane compound satisfying the Chemical Formula 2, were slowly added to react until a Grignard reagent was made and the reaction was confirmed by NMR.

Preparation of Carbon-Bridged Oligomer

After the initial reaction was completed, reaction was continued for 12 hours to form a carbon-bridged oligomer. 50 ml of hexane were then added thereto to precipitate magnesium salts and the precipitates were filtered with celite, and then organic solvent was completely removed in a vacuum oven to obtain a product.

Preparation of Organosilicate Polymer 1.5 g of the obtained product and 4.64 g of methyltrimethoxysilane, an organosilane compound satisfying the Chemical Formula 3, were mixed in 11.3 ml of tetrahydrofuran solvent.

The temperature of the mixture was lowered to 0° C., and 1.78 ml of distilled water and 0.21 ml of a catalyst, 2 N hydrochloric acid, were slowly added thereto to react for 30 minutes. Then, the temperature was slowly elevated to 80° C. and the reaction was continued for 16 hours while heat-refluxing. After the reaction, the mixture was diluted with diethylether solvent and washed with distilled water 3 to 4 times until acidity became neutral. Remaining solvents were completely removed from the obtained organic layer in a vacuum oven to obtain a solid (powder) product.

Preparation of an Insulating Film 300 mg of the obtained powder were dissolved in methylisobutyl ketone to set a total weight of solution to 1.5 g. Impurities were removed from the obtained solution through a filter and the solution was spin-coated to obtain a thin film. An insulating film was prepared through drying and curing processes, elevating the temperature to 430° C. at a rate of 2° C. per minute and maintaining the temperature for 1 hour under a nitrogen atmosphere.

Example 2

Preparation of an Organometallic Silane Compound Represented by the Chemical Formula 1

After introducing 0.71 g of magnesium into a reaction vessel and drying it, 15 ml of solvent-distilled tetrahydrofuran(THF) were added thereto. The temperature of the mixture was lowered to 0° C., and 0.2 g of dichloromethane and 0.2 g of chloromethyl triethoxysilane, an organosilane compound satisfying the Chemical Formula 2, were slowly added thereto. When a Grignard reagent began to be produced, 4.8 g of chloromethyl triethoxysilane, an organic compound satisfying the Chemical Formula 2, were further slowly added to prepare a Grignard reagent, and the reaction was confirmed by NMR.

Preparation of Carbon-Bridged Oligomer 5.37 g of tetramethoxy silane, a compound satisfying the Chemical Formula 3, and 15 ml of tetrahydrofuran were slowly added to the above solution and the mixture was agitated at 0° C. for 2 hours. 50 mL of hexane were added thereto to precipitate magnesium salts, and the precipitates were filtered with celite. Organic solvents were then completely removed therefrom in a vacuum oven to obtain a carbon-bridged silane oligomer product.

Preparation of an Organosilicate Polymer 44.2 g of the obtained carbon-bridged silane oligomer and 18.17 g of methyltrimethoxysilane, an organosilane compound satisfying the Chemical Formula 3, were mixed in 30 ml of tetrahydrofuran solvent.

The temperature of the mixture was lowered to 0° C., and 8.0 ml of distilled water and 0.98 ml of a catalyst, 5 N hydrochloric acid, were slowly added thereto to react for 30 minutes. Then, the temperature was slowly elevated to 80° C. and reaction was continued for 16 hours while heat-refluxing. After the reaction, the mixture was distilled with diethylether solvent and washed with distilled water 3 to 4 times until the acidity became neutral. Remaining solvents were completely removed from the obtained organic layer in a vacuum oven to obtain a solid (powder) product.

Preparation of an Insulating Film

The obtained powder was dried and cured by the same method as in Example 1, to prepare an insulating film.

Example 3

Preparation of Organosilicate Polymer 9 g of the carbon-bridged oligomer obtained by the same method as in Example 1, 30.0 g of methyltrimethoxy silane, and 3.4 g of tetramethoxysilane were mixed in 60 ml of tetrahydrofuran solvent.

The temperature of the mixture was lowered to 0° C., and 37 ml of a catalyst, 0.01 N nitric acid, were slowly added thereto to react for 30 minutes. Then, the temperature was slowly elevated to 70° C. and the reaction was continued for 16 hours while heat-refluxing. After reaction, the mixture was diluted with diethylether solvent and washed with distilled water 3 to 4 times until acidity became neutral. Remaining solvents were completely removed from the obtained organic layer in a vacuum oven to obtain a solid content.

Preparation of an Insulating Film

The obtained powder was dried and cured by the same method as in Example 1, to prepare an insulating film.

Comparative Example 1

7.26 g of methyltrimethoxy silane, an organosilane compound, and 4.05 ml of distilled water were mixed in 10 ml of tetrahydrofuran (THF) solvent, and 0.80 ml of 2 N hydrochloric acid were slowly added thereto under a nitrogen atmosphere.

After reacting them for 30 minutes at room temperature, the temperature was slowly increased and reaction was continued for 24 hours while heat-refluxing.

After the reaction, the temperature of the solution was lowered to room temperature, and the solution was diluted with diethylether solvent and washed with water 3 to 4 times until the acidity became neutral. Magnesium sulfate was introduced into the obtained organic layer to completely remove remaining water therefrom. Solvents were completely removed from the obtained organic layer in a vacuum oven to obtain a solid (powder) product.

Preparation of an Insulating Film

The obtained powder was dried and hardened by the same method as in Example 1 to prepare an insulating film.

Physical properties of the organosilicate polymer prepared in Examples 1, 2, 3 and Comparative Example 1 were measured by the following methods a)–c) to obtain the results shown in Table 1.

a) Molecular Weight (Mass average molecular weight: Mw)–Relative molecular weight value was obtained by Gel Permeation Chromatography (GPC) using a polystyrene as a standard.

b) Mechanical Properties of Thin Film—Measured after spin-coating on 2×2 inch Si wafer and hardening at 430° C. for 1 hour under $N_2$ atmosphere.

i) Hardness—Measured using TriboIndenter from Hysitron Inc.

ii) Crack Resistance—A 1 μm thin film was prepared to observe whether cracks occurred.

c) Dielectric Properties of Film—A MIM (metal/insulator/semiconductor) device was manufactured on a Si wafer and dielectric properties were measured at 1 MHz using an LCR meter from HP Company.

Results are shown in Table 1.

TABLE 1

|  | Example 1 | Example 2 | Example 3 | Comparative Example 1 |
|---|---|---|---|---|
| Mw | 11807 | 27716 | 3100 | 11000 |
| Hardness | 0.62 | 0.58 | 1.1 | 0.32 |
| Crack Resistance | 2.4E12 | 5.3E–12 | 1.2E–12 | 1.3E–9 |
| Dielectric Constant | 2.78 | 2.75 | 2.83 | 2.73 |

As shown in Table 1, a thin film manufactured from the organosilicate polymer of the present invention has good dielectric properties and improved mechanical strength and crack resistance.

The organosilicate polymer prepared according to the present invention is thermally stable and has good film-forming properties, excellent mechanical strength and crack resistance, and the film manufactured therefrom has excellent insulating properties, film uniformity, dielectric properties, crack resistance, and mechanical strength.

What is claimed is:

1. A composition for forming an insulating film for a semiconductor device, comprising a) an organosilicate polymer prepared by a process comprising the steps of
   i) providing an organometallic silane compound represented by Chemical Formula 1 below;
   ii) causing a Grignard reaction of
      the i) organometallic silane compound alone, or
      the i) organometallic silane compound and a silane compound or silane oligomer to prepare a carbon-bridged silane oligomer and remove metal compound by products; and
   iii) mixing the ii) carbon-bridged silane oligomer in organic solvent, and adding water and a catalyst thereto to cause hydrolysis and condensation to prepare an organosilicate polymer; and b) an organic solvent:

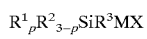   Chemical Formula 1 wherein $R^1$ is independently hydrogen, fluorine, aryl, vinyl, allyl, or fluorine substituted or unsubstituted linear or branched $C_{1-4}$ alkyl;

$R^2$ is independently chlorine, acetoxy, hydroxy, or linear or branched $C_{1-4}$ alkoxy;

$R^3$ is $C_{1-6}$ hydrocarbon;

M is magnesium, mercury, or copper;

X is halogen; and p is an integer of 0 to 2.

2. The composition for forming an insulating film according to claim 1, further comprising, c) one or more additives selected from the group consisting of organic molecules, organic polymer, organic dendrimer, colloidal silica, aerosol, xerosol, and surfactant.

3. A process for manufacturing an insulating film for a semiconductor device, comprising the steps of:

a) coating the composition of claim 1 on a substrate of a semiconductor device to prepare a coated insulating film and b) drying and curing the coated insulating film.

4. The process for manufacturing an insulating film according to claim 3, wherein the a) composition further comprises one or more additives selected from the group consisting of organic molecules, organic polymer, organic dendrimer, colloidal silica, aerosol, xerosol, and surfactant.

5. A semiconductor device comprising an insulating film prepared according to the process of claim 3.

* * * * *